(12) United States Patent
Ito et al.

(10) Patent No.: US 6,595,194 B1
(45) Date of Patent: Jul. 22, 2003

(54) IGNITION SYSTEM FOR INTERNAL COMBUSTION ENGINE

(75) Inventors: Takashi Ito, Ibaraki-ken (JP); Ryoichi Kobayashi, Ibaraki-ken (JP); Noboru Sugiura, Mito (JP); Katsuaki Fukatsu, Ibaraki-ken (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 09/763,837

(22) PCT Filed: May 26, 2000

(86) PCT No.: PCT/JP00/03387

§ 371 (c)(1), (2), (4) Date: May 25, 2001

(87) PCT Pub. No.: WO01/90572

PCT Pub. Date: Nov. 29, 2001

(51) Int. Cl.[7] .................................................. F02P 3/12
(52) U.S. Cl. ........................................ 123/644; 123/650
(58) Field of Search .................................. 123/644, 650, 123/651, 655; 315/209 T, 224

(56) References Cited

U.S. PATENT DOCUMENTS

| | | | | |
|---|---|---|---|---|
| 5,970,964 A | * | 10/1999 | Furuhata et al. | 123/644 |
| 6,286,491 B1 | * | 9/2001 | Fukatsu et al. | 123/644 |
| 6,336,448 B1 | * | 1/2002 | Furuhata et al. | 123/644 |

FOREIGN PATENT DOCUMENTS

JP      9-280147      10/1997

* cited by examiner

*Primary Examiner*—Mahmoud Gimie
(74) *Attorney, Agent, or Firm*—Crowell & Moring LLP

(57) ABSTRACT

A main IGBT conducts or blocks a primary current flowing through the ignition coil in response to an input ignition control signal to generate a high voltage on the secondary side of the ignition coil. The main IGBT and a current limiter circuit are integrated in a monolithic silicon substrate of an insulating gate bipolar power transistor. The main IGBT has a collector and agate connected through a depletion IGBT forming part of a constant current circuit, and a resistor. When a voltage generated across the resistor becomes equal to or higher than a zener voltage, a zener diode leads this current to an emitter of the main IGBT.

7 Claims, 6 Drawing Sheets ously known one-chip ignition system, for example, as described in
IGNITION SYSTEM FOR INTERNAL COMBUSTION ENGINE

TECHNICAL FIELD

The present invention relates to an ignition system for an internal combustion engine, and more particularly, to an ignition system for an internal combustion engine suitable for use in an integrated control circuit.

BACKGROUND ART

Recently, a one-chip ignition system has been developed as an ignition system for an internal combustion engine which has a power IGBT (insulating gate bipolar transistor), a current limiter circuit and an input stage protection circuit fabricated on a monolithic substrate. A conventional known one-chip ignition system, for example, as described in JP-A-9-280147, is configured to supply a small constant current from a collector to a gate by a high voltage constant current device to apply the gate with a voltage when a collector voltage is higher than a gate voltage. This known one-chip ignition system limits oscillations of the collector voltage immediately after starting a current limitation by increasing the gate voltage with the collector voltage increased immediately after starting the current limitation, and suppresses oscillations of the collector voltage during the current limitation by releasing the operation of increasing the gate voltage, when no gate voltage is applied, so as to prevent a gate potential from increasing, while the current is blocked, by the influence of the small constant current.

DISCLOSURE OF THE INVENTION

However, the ignition system for an internal combustion engine described in JP-A-9-280147 has a problem in that a stray current is generated in an actual substrate so that a large current exceeding a value set by a constant current circuit flows through this route to cause an increase in the gate potential. Particularly, when the ignition system comprises a self separation type device, a vertical depletion IGBT is used in the constant current circuit. In the constant current circuit comprising the vertical depletion IGBT formed in self separation in an IGBT substrate, a PNP parasitic transistor exists. A stray current flows into the PNP parasitic transistor, causing an excessive current to flow through a circuit provided for purposes of controlling the gate voltage with a small constant current, with the result that the gate voltage is increased more than necessary. This influence causes a problem of an instable current blocking operation of an ignition coil depending on an ignition system driving method.

It is an object of the present invention to provide an ignition system for an internal combustion engine which allows an ignition coil to perform a stable current blocking operation.

(1) To achieve the above object, the present invention provides an ignition system for an internal combustion engine having a power switching unit for controlling to conduct or block a primary current flowing through an ignition coil in response to an input ignition control signal to generate a high voltage on a secondary side of the ignition coil, a current limiter circuit for limiting the primary current, and a connection circuit for connecting a collector and a gate of the power switching unit, wherein the power switching unit and the current limiter circuit are integrated in a monolithic silicon substrate of an insulating gate bipolar power transistor, the ignition system for an internal combustion engine comprising a path for leading a stray current generated within the monolithic silicon substrate to an emitter of the power switching unit.

With the configuration as described, an unwanted stray is led to the emitter to reduce the influence exerted on the gate, thereby making it possible to stabilize a current blocking operation of the ignition coil.

(2) In the foregoing (1), preferably, the connection circuit comprises an impedance element, and the path comprises a zener diode which operates in accordance with a voltage drop across the impedance element.

(3) In the foregoing (1), preferably, the connection circuit is comprised of a depletion insulating gate bipolar power transistor constituting a constant current circuit formed on the monolithic silicon substrate, and a resistor connected to the depletion insulating gate bipolar power transistor, and the path is comprised of a zener diode connected between the depletion insulating gate bipolar power transistor and the resistor and operative when a voltage generated across the resistor becomes equal or higher than a zener voltage for leading the current to the emitter of the power switching unit.

BEST MODE FOR CARRYING OUT THE INVENTION

In the following, an ignition system for an internal combustion engine according to one embodiment of the present invention will be described in terms of the configuration and operation with reference to FIGS. 1 to 6.

Figure 1:
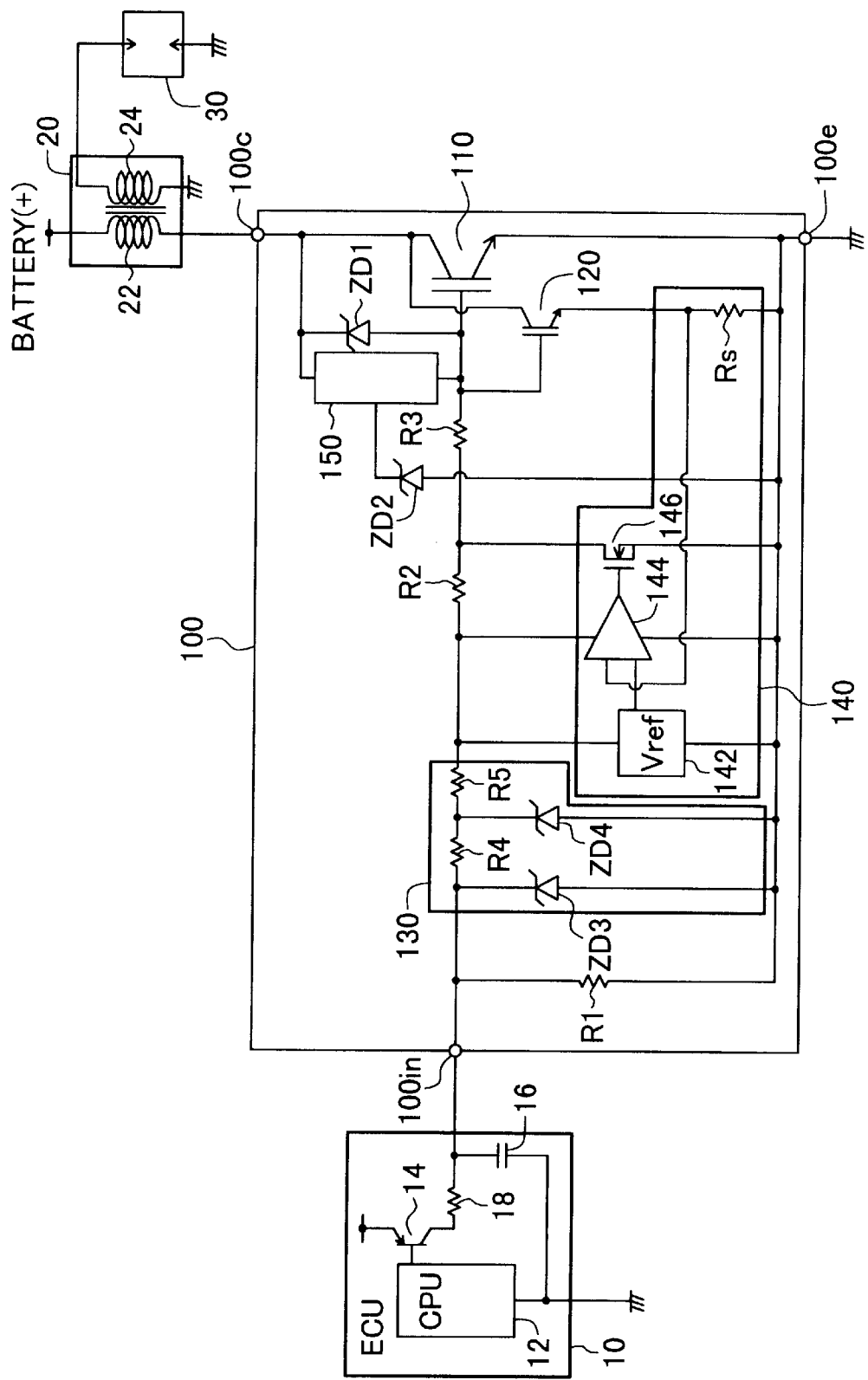
FIG. 1 is a system configuration diagram of an ignition system for an internal combustion engine which employs an ignition system for an internal combustion engine according to one embodiment of the present invention.

Referring first to FIG. 1, the system configuration will be described for an ignition system for an internal combustion engine which employs an ignition system for an internal combustion engine according to this embodiment.

FIG. 1 is a system configuration diagram of the ignition system for an internal combustion engine which employs the ignition system for an internal combustion engine according to one embodiment of the present invention.

The ignition system for an internal combustion engine according to this embodiment comprises an ignition system 100; an ECU (engine control unit) 10; an ignition coil 20; and an ignition plug 30.

The ECU 10 comprises a CPU 12; a PNP transistor 14; a capacitor 16; and a resistor 18. The PNP transistor 14, capacitor 16 and resistor 18 form an output stage of the ECU 10. The CPU 12 turns ON or OFF the transistor 14 at a calculated proper ignition timing to output an ignition control signal comprised of HIGH and LOW pulses at an input terminal 100in of the ignition system 100.

While the detailed configuration of the ignition system 100 will be described later, a main IGBT 110 of the ignition system 100 starts conducting when an output signal of the ECU 10 transitions from LOW to HIGH, and is blocked when the output signal transitions from HIGH to LOW to generate a voltage at a collector terminal 110c of the main IGBT 110.

The ignition coil 20 has a primary coil 22 and a secondary coil 24. The voltage generated at the collector terminal 110c of the main IGBT 110 is supplied to the primary coil 22 of the ignition coil 20 to induce in the secondary coil 24 a high voltage corresponding to a multiple of a winding ratio of the primary coil 22 to the secondary coil 24 of the ignition coil 20. The voltage generated in the secondary coil of the ignition coil 20 (hereinafter called the "secondary voltage") is supplied to the ignition plug 30. Also, since the secondary voltage varies depending on an engine operating condition, the voltage generated at the collector terminal 100c also varies. For example, when an ignition coil of a winding ratio equal to 100 has a secondary voltage of 15 kV, a voltage of approximately 150 V is generated at the collector terminal 110c.

Next, the configuration of the ignition system 100 will be described.

The ignition system 100 according to this embodiment is a one-chip IGBT ignition system which has a power IGBT and a control circuit such as a current limiter circuit, an input stage protection circuit and so on integrated on a monolithic substrate.

The ignition system 100 comprises a main IGBT 110; a sense IGBT 120; an input stage protection circuit 130; a current limiter circuit 140; a feedback circuit 150; zener diodes ZD1, ZD2; and resistors R1, R2, R3.

The resistor R1 disposed in an input stage of the ignition system 100 is a pull-down resistor through which a current corresponding to an input voltage is fed to ensure a contact current at an input terminal 100in. At a stage subsequent to the pull-down resistor R1, the input stage protection circuit 130 is connected. The input stage protection circuit 130, which is comprised of zener diodes ZD3, ZD4 and resistors R4, R5 in a network configuration, ensures a sufficient amount of allowance for an expected external surge and so on as an electronic part for an automobile.

The output of the input stage protection circuit 130 is inputted to a gate of the main IGBT 100 through the resistors R2, R3. The main IGBT 110 constitutes a main circuit for conducting and blocking a primary current. The main IGBT 110 has a collector connected to a collector terminal 100c of the ignition system 100 and also connected to the primary coil 22 of the ignition coil 20. The main IGBT 110 has an emitter connected to an emitter terminal 100e of the ignition system 100 and also to a ground. The zener diode ZD1 is connected between the collector and the gate of the main IGBT 110 for purposes of clamping a primary voltage.

The sense IGBT 120 constitutes a shunt circuit for detecting a current flowing into the main IGBT 110. The sense IGBT 120 has a gate connected to the gate of the main IGBT 110, and a collector connected to the collector of the main IGBT 110. The sense IGBT 120 has an emitter connected to the emitter of the main IGBT 110 through a current detecting resistor Rs.

The current limiter circuit 140 is composed of the current detecting resistor Rs; a reference voltage circuit 142; a voltage comparator 144; and an NMOS transistor 146. The reference voltage circuit 142 generates a reference voltage Vref. The voltage comparator 144 compares the reference voltage Vref generated by the reference voltage circuit 142 with a voltage generated across the current detecting resistor Rs. When the voltage across the current detecting resistor Rs increases to the reference voltage Vref or more, the voltage comparator 144 turns ON the NMOS transistor 146 to reduce a voltage applied to the gate of the main IGBT 110 to bring the main IBGT 110 in an unsaturated state, thereby limiting a collector current.

The feedback circuit 150 is connected between the collector and the gate of the main IGBT 110. The feedback circuit 150 is a circuit for supplying a feedback current from the collector of the main IGBT 110 to the gate of the main IGBT 110. Since the IGBT 110 has an extremely weak negative feedback function due to its inherent nature, a collector voltage largely oscillates upon starting a current limitation. The feedback circuit 150 acts to supply a small current from the collector to the gate to raise a gate potential in order to suppress the oscillations when the collector voltage becomes higher than a gate voltage.

Further, in this embodiment, the feedback circuit 150 is provided with the zener diode ZD2 which forms part of a leak path for leading an unwanted current (a stray current generated within the IGBT) to the emitter of the main IGBT 110. The detailed configuration of the feedback circuit will be described later with reference to FIG. 3.

Here, the structure of the mounted ignition system 100 according to this embodiment will be described with reference to FIG. 2.

Figure 2:
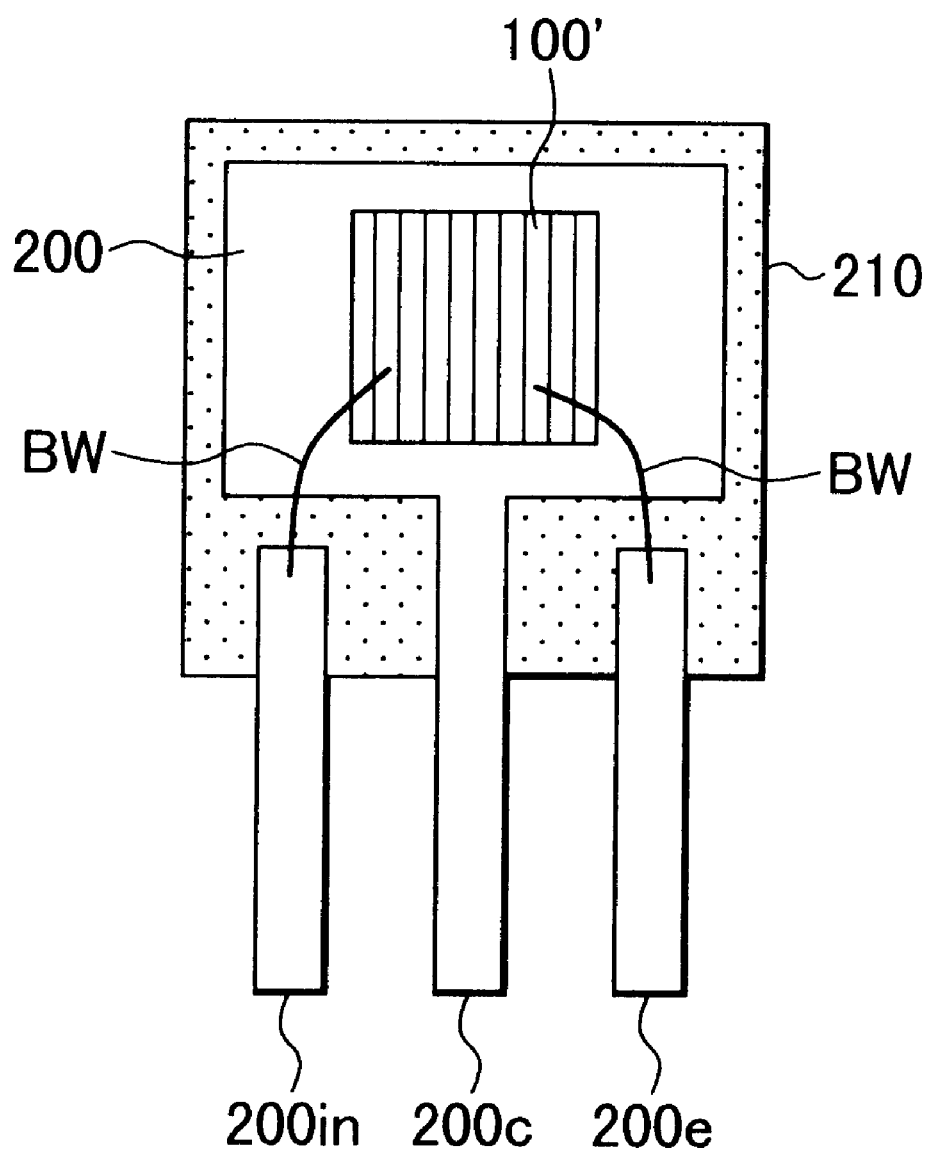
FIG. 2 is a plan view illustrating the structure of the mounted ignition system for an internal combustion engine according to the embodiment of the present invention.

FIG. 2 is a plan view illustrating the structure of the mounted ignition system for an internal combustion engine according to the embodiment of the present invention.

An IGBT monolithic substrate 100' is a monolithic substrate which is formed with the ignition system 100 comprised of the main IGBT 110, current limiter circuit 140, input stage protection circuit 130 and so on, illustrated in FIG. 1, integrated in one chip. On a plate 200 which also serves as a collector terminal 200c, the IGBT monolithic substrate 100' is securely connected using a solder material or the like. The collector terminal 100c of the ignition system 100 illustrated in FIG. 1 is connected to the plate 200. An input terminal 200in is bonded to the input terminal 100in of the ignition system 100 using a bonding wire BW. An emitter terminal 200e is bonded to the emitter 100e of the ignition system 100 using a bonding wire BW. The IGBT monolithic substrate 100', plate 200, emitter terminal 200e and input terminal 200in are molded into a one-chip package using a transfer mold resin 210.

Next, the influence of a stray current generated within the IGBT in the ignition system 100 according to this embodiment, and an effect produced when the stray current is reduced will be explained with reference to FIGS. 3 and 4.

Figure 3:
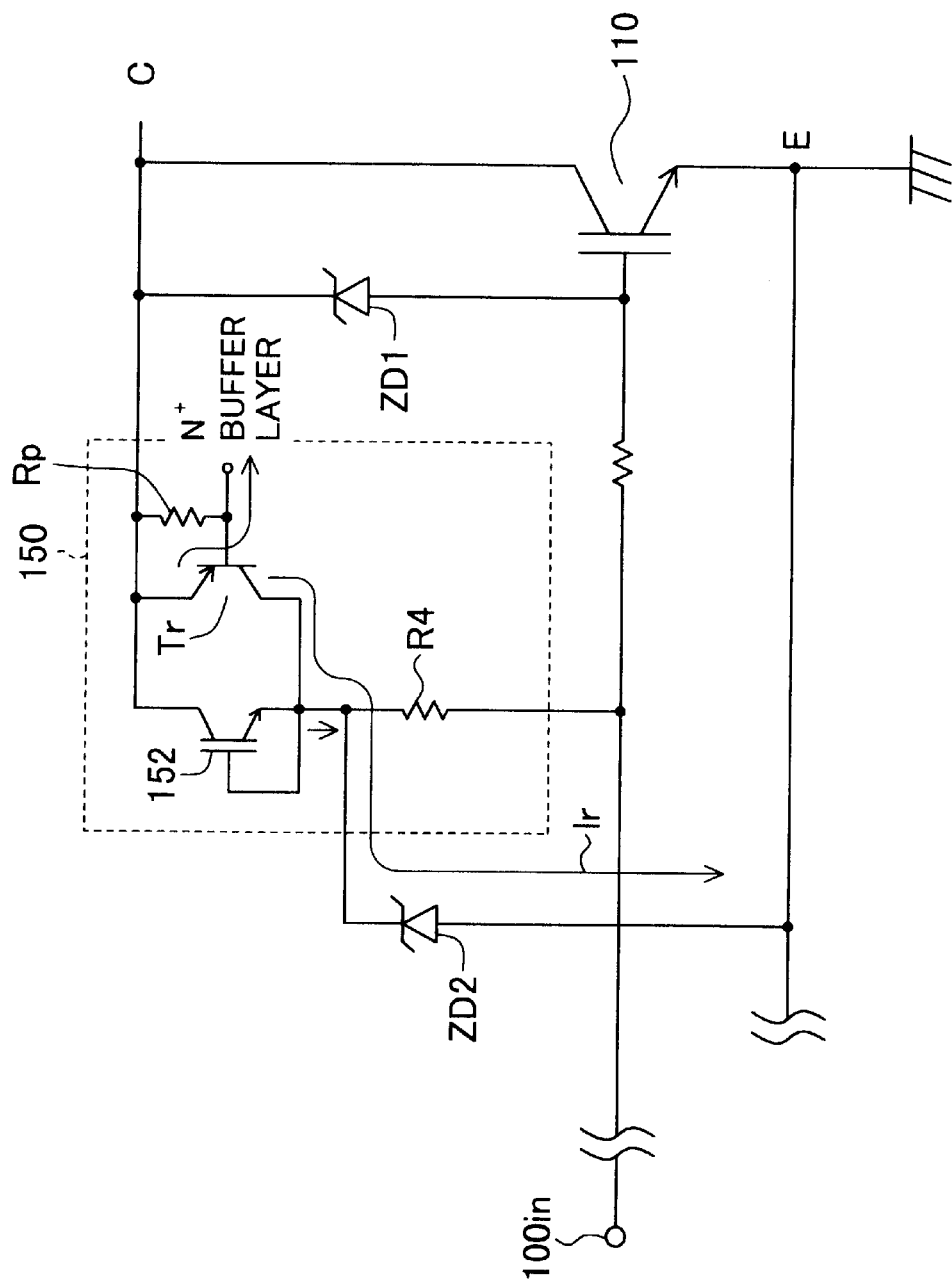
FIG. 3 is a circuit diagram for explaining the influence of a stray current generated within an IGBT in an ignition system 100 according to one embodiment of the present invention and an effect of reducing the stray current.
Figure 4:
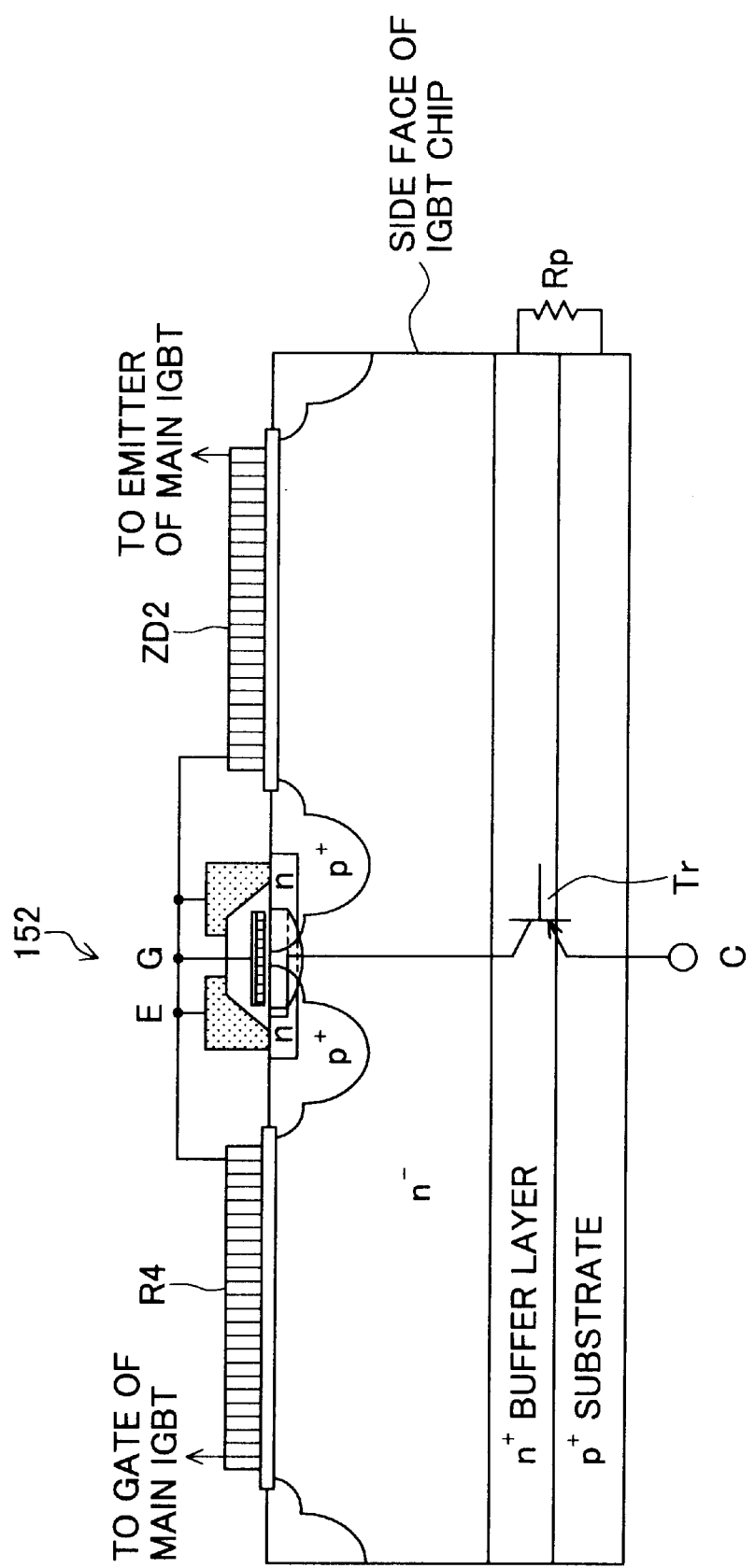
FIG. 4 is an explanatory diagram for the influence of the stray current generated within the IGBT in the ignition system 100 according to the embodiment of the present invention and the effect of reducing the stray current.

FIG. 3 is a circuit diagram for explaining the influence of a stray current generated within the IGBT in the ignition system 100 according to this embodiment of the present invention, and an effect produced when the stray current is reduced, while FIG. 4 is an explanatory diagram of the influence of the stray current generated within the IGBT in the ignition system 100 according to this embodiment of the present invention, and an effect produced when the stray current is reduced. The same reference numerals as those in FIG. 1 designate the same parts.

As illustrated in FIG. 3, the feedback circuit 150 is comprised of a depletion IGBT 152 and a resistor R4 which form a constant current circuit. The depletion IGBT 152 has a collector connected to the collector of the main IGBT 110. The depletion IGBT 152 has a base and an emitter connected together, and also connected to one end of the resistor R4. The other end of the resistor R4 is connected to the base of the main IGBT 110. In a state in which the collector potential of the main IGBT 110 is increased, the depeletion IGBT 152 supplies a constant current tot he gate to control the IGBT 54 110, so that even if the collector voltage largely oscillates upon starting a current limitation, the gate potential is raised by supplying a small current from the collector to the gate to suppress the oscillations.

Here, in the vertical depletion IGBT 152 formed in the IGBT monolithic substrate 100' in a self separation configuration, a parasitic PNP transistor Tr, and a parasitic resistor Rp fabricated on a side face of the IGBT chip exist, as illustrated in FIGS. 3 and 4. The parasitic PNP transistor Tr has a base driven by an electron current generated by a potential gradient in an $N^+$ buffer layer within the IGBT monolithic substrate, when the main IGBT 110 blocks a current, so that an amplified stray current is led to the collector of the parasitic PNP transistor Tr. Also, since the size of the parasitic resistor Rp existing on the side face of the chip causes variations in apparent Hfe of the parasitic PNP transistor Tr, the stray current cannot be defined, causing an excessive current to flow.

To overcome this problem, in this embodiment, the zener diode ZD2 is connected between the depletion IGBT 152 and the series resistor R4 as illustrated in FIG. 3. The zener diode ZD2 has an anode connected to the emitter of the main IGBT 110. The base of the parasitic PNP transistor Tr is driven by an electron current generated in the $N^+$ buffer layer within the IGBT monolithic substrate, causing an amplified current to flow into the collector. However, when a voltage drop generated across the series resistor R4 becomes equal to or larger than a zener voltage of the zener diode ZD2, the current is fully led to the emitter of the IGBT 110 as an unwanted current Ir, thereby reducing the influence to the gate of the IGBT 110 by this unwanted current.

Here, for reference, a stray current, when the zener diode ZD2 is not provided, will be explained with reference to FIGS. 5 and 6.

Figure 5:
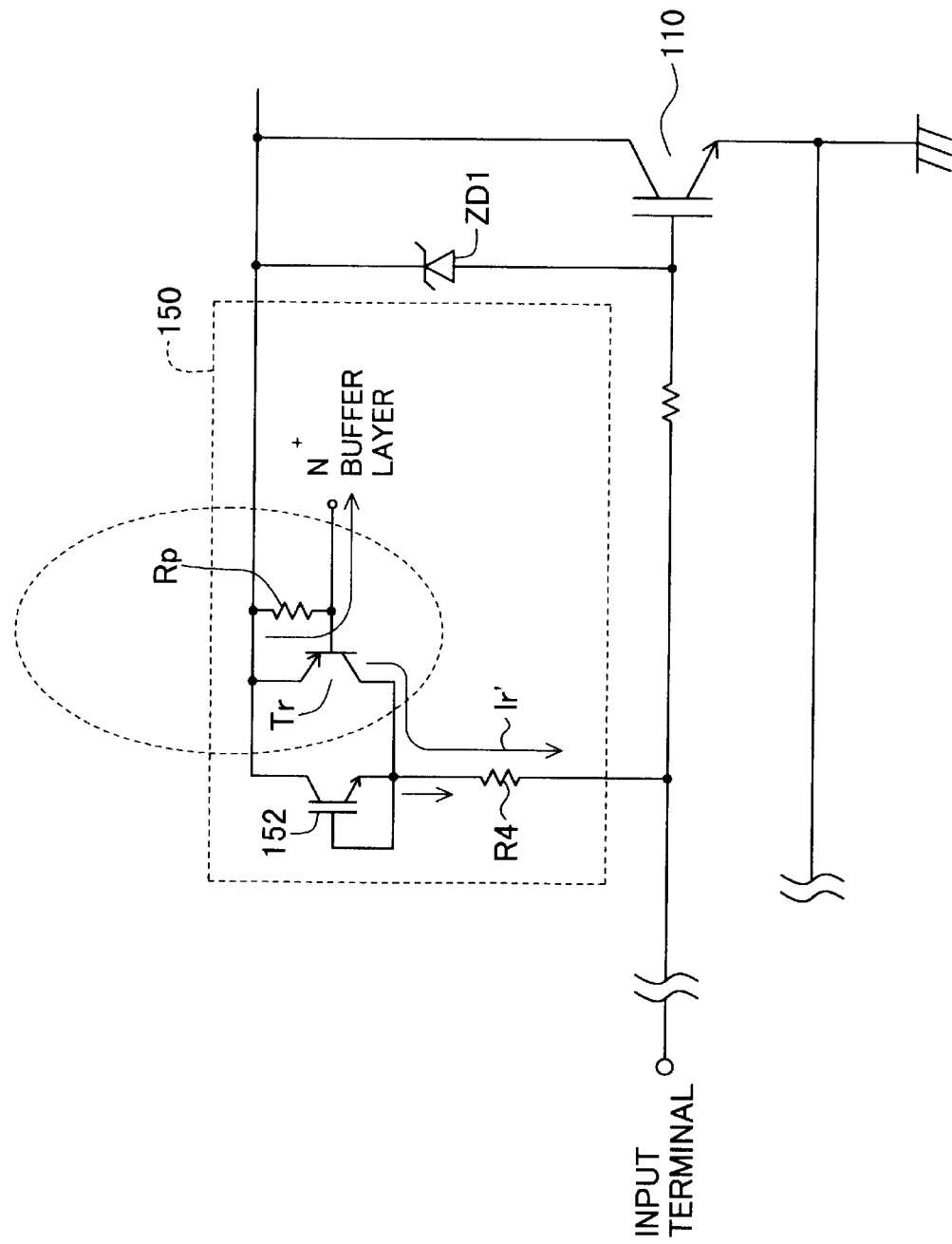
FIG. 5 is a circuit diagram for explaining a stray current generated within an IGBT.
Figure 6:
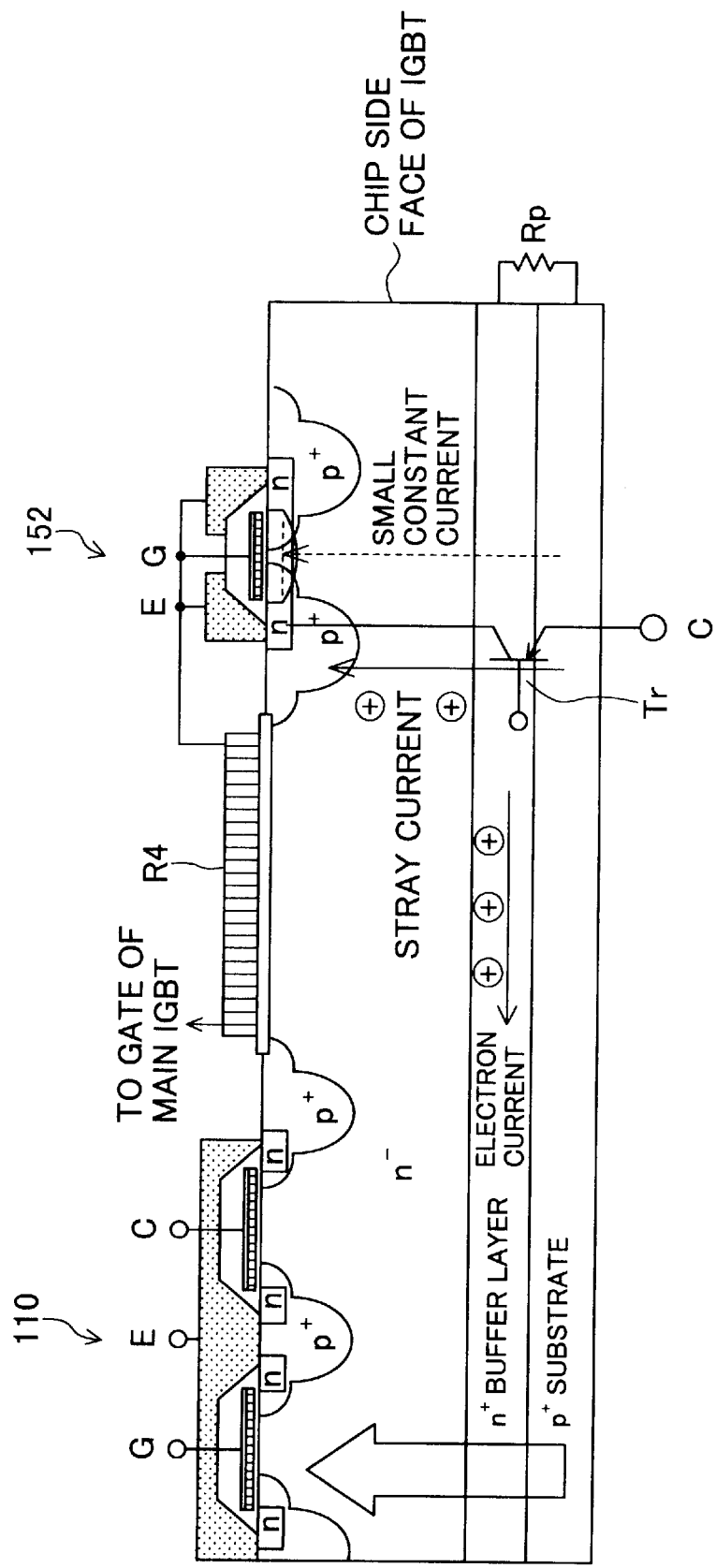
FIG. 6 is an explanatory diagram of the stray current generated within the IGBT.

FIG. 5 is a circuit diagram for explaining a stray current generated within an IGBT, while FIG. 6 is an explanatory diagram of the stray current generated within the IGBT. The same reference numerals as those in FIGS. 3, 4 designate the same parts.

A base of a parasitic PNP transistor Tr is driven by an electron current generated by a potential gradient in an N+ buffer layer within an IGBT substrate when the main IGBT 110 blocks a current, so that an amplified stray current Ir'0 flows through a collector of the parasitic PNP transistor Tr to the gate of the main IGBT 110, causing the gate potential to unnecessarily increase. Particularly, an excessively large stray current Ir' is likely to be generated by the collector voltage which increases upon blocking a current. This raises the gate potential and makes the blocking operation instable.

As described above, according to this embodiment, by providing a path for leading an unwanted current due to the influence of the stray current from the collector of the main IGBT 110 to the emitter, like the zener diode ZD2, a stable current blocking operation of the ignition coil can be accomplished. It is therefore possible to create a control circuit such as a current limiter circuit and an input stage protection circuit using a transistor fabricated in a self separation layer. In this way, the integration on the monolithic silicon substrate of the IGBT can be accomplished with a minimum process, thereby making it possible to provide a one-chip ignition system which exhibits a stable operation and a high reliability.

Availability of Industrial Utilization

According to the present invention, a current blocking operation of an ignition coil can be stabilized in an ignition system for an internal combustion engine.

What is claimed is:

1. An ignition system for an internal combustion engine having a power switching unit for controlling to conduct or block a primary current flowing through an ignition coil in response to an input ignition control signal to generate a high voltage on a secondary side of the ignition coil, a current limiter circuit for limiting said primary current, and a connection circuit for connecting a collector and a gate of said power switching unit, wherein said power switching unit and said current limiter circuit are integrated in a monolithic silicon substrate of an insulating gate bipolar power transistor, said ignition system for an internal combustion engine and a path in provided for leading a stray current generated within said monolithic silicon substrate to an emitter of said power switching unit when an input signal to said gate of said power switching unit is an off-state signal.

2. An ignition system for an internal combustion engine according to claim 1, characterized in that:

said connection circuit comprises an impedance element; and said path comprises a zener diode (ZD2) which operates in accordance with a voltage drop across said impedance element.

3. An ignition system for an internal combustion engine having a power switching unit for controlling to conduct or block a primary current flowing through an ignition coil in response to an input ignition control signal to generate a high voltage on a secondary side of the ignition coil, a current limiter circuit for limiting said primary current, and a connection circuit for connecting a collector and a gate of said power switching unit, wherein said power switching unit and said current limiter circuit are integrated in a monolithic silicon substrate of an insulating gate bipolar power transistor, said ignition system for an internal combustion engine characterized by comprising:

a path for leading a stray current generated within said monolithic silicon substrate to an emitter of said power switching unit;

said connection circuit being comprised of a depletion insulating gate bipolar power transistor constituting a constant current circuit formed on said monolithic silicon substrate, and a resistor connected to said depletion insulating gate bipolar power transistor; and said path being comprised of a zener diode connected between said depletion insulating gate bipolar power transistor and said resistor and operative when a voltage generated across said resistor becomes equal or higher than a zener voltage for leading said current to the emitter of said power switching unit.

4. An ignition system for an internal combustion engine having a power switching unit for controlling to conduct or block a primary current flowing through an ignition coil in response to an input ignition control signal to generate a high voltage on a secondary side of the ignition coil, a current limiter circuit for limiting said primary current, and a connection circuit for connecting a collector and a gate of said power switching unit, wherein said power switching unit and said current limiter circuit are integrated in a monolithic silicon substrate of an insulating gate bipolar power transistor, said ignition system for an internal combustion engine characterized by comprising:

a path for leading a stray current generated within said monolithic silicon substrate to an emitter of said power switching unit without passing through said gate of said power switching unit.

5. An ignition system for an internal combustion engine according to claim 4, said connection circuit comprises an impedance element; and said path comprises a zener diode which operates in accordance with a voltage drop across said impedance element.

6. An ignition system for an internal combustion engine;

an ignition system for an internal combustion engine having a power switching unit for controlling to conduct or block a primary current flowing through an ignition coil in response to an input ignition control signal to generate a high voltage on a secondary side of the ignition coil, a current limiter circuit for limiting said primary current, and a connection circuit for connecting a collector and a gate of said power switching unit, wherein said power switching unit and said current limiter circuit are integrated in a monolithic silicon substrate of an insulating gate bipolar power transistor, said ignition system for an internal combustion engine characterized by comprising:

a path for leading a stray current generated within said monolithic silicon substrate to an emitter of said power switching unit, wherein said connection circuit comprises an impedance element; and said path comprises a zener diode which operates in accordance with a voltage drop across said impedance element.

7. An ignition system for an internal combustion engine having a power switching unit for controlling to conduct or block a primary current flowing through an ignition coil in response to an input ignition control signal to generate a high voltage on a secondary side of the ignition coil, a current limiter circuit for limiting said primary current, and a connection circuit for connecting a collector and a gate of said power switching unit, wherein said power switching unit and said current limiter circuit are integrated in a monolithic silicon substrate of an insulating gate bipolar power transistor, said ignition system for an internal combustion engine characterized by comprising:

a path for leading a stray current generated within said monolithic silicon substrate to an emitter of said power switching unit when said power switching unit blocks current.

* * * * *